United States Patent
Kang

(10) Patent No.: US 12,142,662 B2
(45) Date of Patent: Nov. 12, 2024

(54) METHOD FOR MAKING NANOSTRUCTURE TRANSISTORS WITH OFFSET SOURCE/DRAIN DOPANT BLOCKING STRUCTURES INCLUDING A SUPERLATTICE

(71) Applicant: Atomera Incorporated, Los Gatos, CA (US)

(72) Inventor: Donghun Kang, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/613,356

(22) Filed: Mar. 22, 2024

(65) Prior Publication Data

US 2024/0322005 A1    Sep. 26, 2024

Related U.S. Application Data

(60) Provisional application No. 63/507,578, filed on Jun. 12, 2023, provisional application No. 63/492,038, filed on Mar. 24, 2023.

(51) Int. Cl.
*H01L 29/66* (2006.01)
*H01L 29/06* (2006.01)
(Continued)

(52) U.S. Cl.
CPC .... *H01L 29/66439* (2013.01); *H01L 29/0603* (2013.01); *H01L 29/15* (2013.01); *H01L 29/41741* (2013.01); *H01L 29/42392* (2013.01)

(58) Field of Classification Search
CPC ........... H01L 29/66439; H01L 29/0603; H01L 29/15; H01L 29/41741; H01L 29/42392
See application file for complete search history.

(56) References Cited

U.S. PATENT DOCUMENTS 4,937,204 A    6/1990    Ishibashi et al.
5,216,262 A    6/1993    Tsu
(Continued)

FOREIGN PATENT DOCUMENTS

GB    2347520    6/2000

OTHER PUBLICATIONS

R. Tsu "Phenomena in silicon nanostructure device" published online Sep. 6, 2000 by Applied Physics and Materials Science & Processing, pp. 391-402.
(Continued)

*Primary Examiner* — Marc Anthony Armand
(74) *Attorney, Agent, or Firm* — ALLEN, DYER, DOPPELT, + GILCHRIST, P.A.

(57) ABSTRACT

A method for making semiconductor device may include forming spaced apart gate stacks on a substrate defining respective trenches therebetween. Each gate stack may include alternating layers of first and second semiconductor materials, with the layers of the second semiconductor material defining nanostructures. The method may further include forming respective source/drain regions within the trenches, forming respective insulating regions adjacent lateral ends of the layers of the first semiconductor material, and forming respective dopant blocking superlattices adjacent lateral ends of the nanostructures and offset outwardly from adjacent surfaces of the insulating regions. Each dopant blocking superlattice may include a plurality of stacked groups of layers, with each group of layers comprising stacked base semiconductor monolayers defining a base semiconductor portion, and at least one non-semiconductor monolayer constrained within a crystal lattice of adjacent base semiconductor portions.

20 Claims, 21 Drawing Sheets

(51) Int. Cl.
*H01L 29/15* (2006.01)
*H01L 29/417* (2006.01)
*H01L 29/423* (2006.01)

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,376,337 B1 | 4/2002 | Wang et al. |
| 6,447,933 B1 | 9/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,402,512 B2 | 7/2008 | Derraa et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,716,147 B2 | 7/2017 | Mears |
| 9,721,790 B2 | 8/2017 | Mears et al. |
| 9,722,046 B2 | 8/2017 | Mears et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,797,163 B1 | 10/2020 | Yu et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 11,075,078 B1 | 7/2021 | Cody et al. |
| 11,094,818 B2 | 8/2021 | Takeuchi et al. |
| 11,177,351 B2 | 11/2021 | Weeks et al. |
| 11,183,565 B2 | 11/2021 | Burton et al. |
| 11,302,823 B2 | 4/2022 | Weeks et al. |
| 11,329,154 B2 | 5/2022 | Takeuchi et al. |
| 11,355,667 B2 | 6/2022 | Stephenson |
| 11,362,182 B2 | 6/2022 | Shin et al. |
| 11,387,325 B2 | 7/2022 | Stephenson et al. |
| 11,430,869 B2 | 8/2022 | Weeks et al. |
| 11,437,486 B2 | 9/2022 | Burton |
| 11,437,487 B2 | 9/2022 | Burton |
| 11,469,302 B2 | 10/2022 | Takeuchi et al. |
| 11,569,368 B2 | 1/2023 | Takeuchi et al. |
| 11,631,584 B1 | 4/2023 | Hytha et al. |
| 11,664,427 B2 | 5/2023 | Stephenson et al. |
| 11,664,459 B2 | 5/2023 | Stephenson |
| 11,682,712 B2 | 6/2023 | Hytha et al. |
| 11,721,546 B2 | 8/2023 | Hytha et al. |
| 11,728,385 B2 | 8/2023 | Hytha et al. |
| 11,742,202 B2 | 8/2023 | Takeuchi et al. |
| 11,810,784 B2 | 11/2023 | Hytha et al. |
| 11,837,634 B2 | 12/2023 | Weeks et al. |
| 11,848,356 B2 | 12/2023 | Weeks et al. |
| 11,869,968 B2 | 1/2024 | Takeuchi et al. |

(56) References Cited

U.S. PATENT DOCUMENTS

| | | |
|---|---|---|
| 11,923,418 B2 | 3/2024 | Hytha et al. |
| 11,923,431 B2 | 3/2024 | Burton |
| 11,935,940 B2 | 3/2024 | Burton |
| 11,978,771 B2 | 5/2024 | Weeks et al. |
| 2003/0034529 A1 | 2/2003 | Fitzgerald et al. |
| 2003/0057416 A1 | 3/2003 | Currie et al. |
| 2004/0262594 A1 | 12/2004 | Mears et al. |
| 2004/0266116 A1 | 12/2004 | Mears |
| 2005/0029510 A1 | 2/2005 | Mears et al. |
| 2005/0032241 A1 | 2/2005 | Mears et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Stephenson et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2010/0270535 A1 | 10/2010 | Halilov et al. |
| 2011/0215299 A1 | 9/2011 | Rao |
| 2016/0163860 A1 | 6/2016 | Lee |
| 2017/0213913 A1 | 7/2017 | Lee et al. |
| 2019/0058059 A1 | 2/2019 | Stephenson et al. |
| 2019/0348539 A1* | 11/2019 | Yoo ................... H01L 29/516 |
| 2020/0135489 A1 | 4/2020 | Weeks et al. |
| 2020/0286991 A1* | 9/2020 | Basler ............... H01L 29/66068 |
| 2021/0226066 A1 | 7/2021 | Young et al. |
| 2021/0367050 A1 | 11/2021 | Tsai et al. |
| 2022/0005706 A1 | 1/2022 | Weeks et al. |
| 2022/0005927 A1 | 1/2022 | Weeks et al. |
| 2022/0139911 A1 | 5/2022 | Wei et al. |
| 2022/0278204 A1 | 9/2022 | Shin et al. |
| 2022/0278226 A1 | 9/2022 | Hall et al. |
| 2022/0285152 A1 | 9/2022 | Takeuchi et al. |
| 2022/0310786 A1 | 9/2022 | Merchant et al. |
| 2022/0352322 A1 | 11/2022 | Hytha et al. |
| 2022/0359208 A1 | 11/2022 | Lin et al. |
| 2022/0367676 A1 | 11/2022 | Burton |
| 2022/0376047 A1 | 11/2022 | Mears et al. |
| 2022/0384600 A1 | 12/2022 | Mears et al. |
| 2023/0006040 A1 | 1/2023 | Lee et al. |
| 2023/0040606 A1 | 2/2023 | Colombeau et al. |
| 2023/0060784 A1 | 3/2023 | Liu et al. |
| 2023/0122723 A1 | 4/2023 | Weeks et al. |
| 2023/0290862 A1 | 9/2023 | Hall et al. |
| 2023/0352299 A1 | 11/2023 | Takeuchi et al. |
| 2023/0361178 A1 | 11/2023 | Hytha et al. |
| 2023/0395374 A1 | 12/2023 | Hytha et al. |
| 2023/0411491 A1 | 12/2023 | Hytha et al. |
| 2023/0411557 A1 | 12/2023 | Hytha et al. |
| 2024/0063268 A1 | 2/2024 | Weeks et al. |
| 2024/0072095 A1 | 2/2024 | Takeuchi et al. |
| 2024/0072096 A1 | 2/2024 | Takeuchi et al. |
| 2024/0097003 A1 | 3/2024 | Burton |
| 2024/0097026 A1 | 3/2024 | Takeuchi et al. |

OTHER PUBLICATIONS

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/ http://www3.interscience.wiley.com/cgi-bin/abstract/72512946/ start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/# EE Times; retreived from internet Feb. 10, 2022; pp. 3.

U.S. Appl. No. 18/613,401; filed Mar. 22, 2024 Donghun Kang.
U.S. Appl. No. 18/613,435; filed Mar. 22, 2024 Donghun Kang.
U.S. Appl. No. 18/613,476; filed Mar. 22, 2024 Donghun Kang.
U.S. Appl. No. 18/613,509; filed Mar. 22, 2024 Donghun Kang.
U.S. Appl. No. 18/613,557; filed Mar. 22, 2024 Donghun Kang.

Loubet et al. "Stacked nanosheet gate-all-around transistor to enable scaling beyond FinFET" https://www.researchgate.net/publication/319035460; Abstract Only.

* cited by examiner

METHOD FOR MAKING NANOSTRUCTURE TRANSISTORS WITH OFFSET SOURCE/DRAIN DOPANT BLOCKING STRUCTURES INCLUDING A SUPERLATTICE

CROSS-REFERENCE TO RELATED APPLICATIONS

This application claims the benefit of U.S. provisional app. nos. 63/507,578 and 63/492,038 filed Jun. 12, 2023 and Mar. 24, 2023, respectively, which are hereby incorporated herein in their entireties by reference.

TECHNICAL FIELD

The present disclosure generally relates to semiconductor devices, and, more particularly, to metal oxide semiconductor (MOS) devices including nanostructures and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making semiconductor device may include forming a plurality of spaced apart gate stacks on a substrate defining respective trenches therebetween. Each gate stack may include alternating layers of first and second semiconductor materials, with the layers of the second semiconductor material defining nanostructures. The method may further include forming respective source/drain regions within the trenches, forming respective insulating regions adjacent lateral ends of the layers of the first semiconductor material, and forming respective dopant blocking superlattices adjacent lateral ends of the nanostructures and offset outwardly from adjacent surfaces of the insulating regions. Each dopant blocking superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions.

In an example embodiment, the method may further include forming a respective semiconductor buffer layer between each nanostructure and the adjacent dopant blocking superlattice. In some implementations, the method may also include forming a respective lateral bottom dopant blocking superlattice between the substrate and the source/drain regions, with each lateral bottom dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

By way of example, the first semiconductor material may comprise silicon germanium, and the second semiconductor material may comprise silicon. Also by way of example, the source/drain regions may comprise phosphorus doped silicon (Si:P), the base semiconductor monolayers may comprise silicon, and the non-semiconductor monolayers may comprise oxygen.

DETAILED DESCRIPTION

Figure 1:
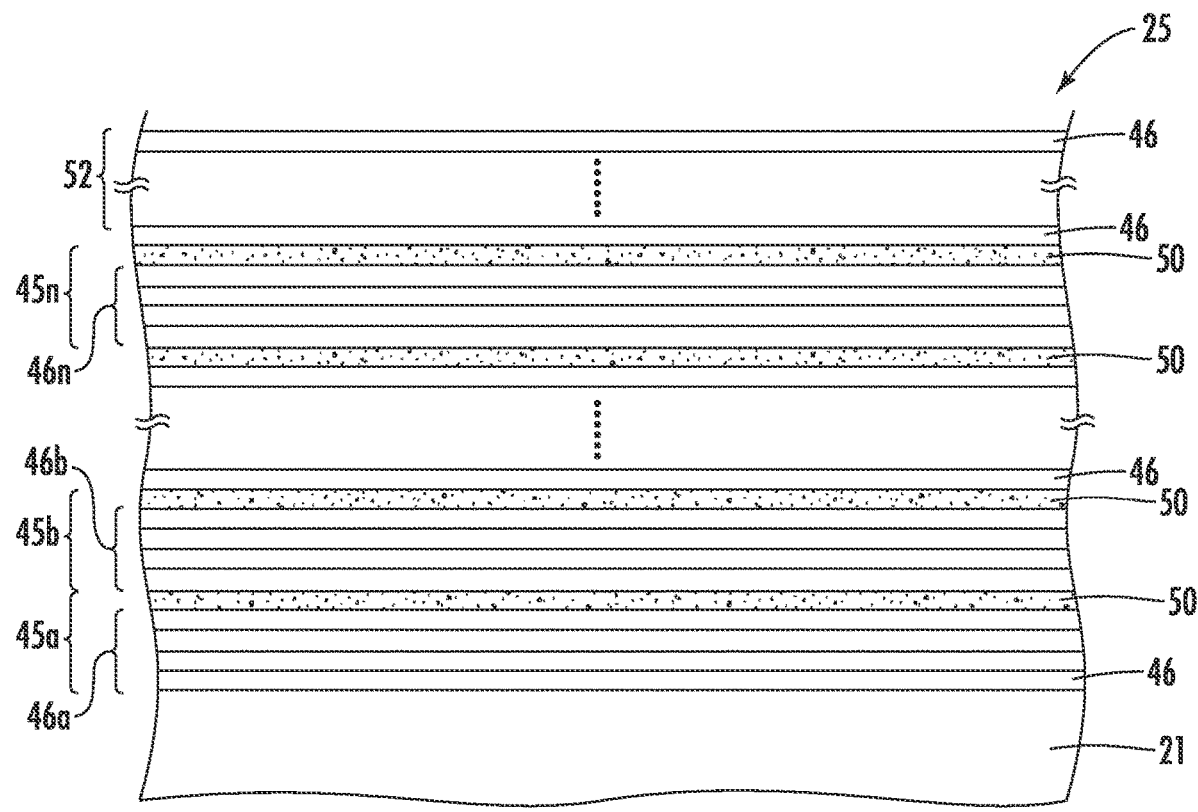
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. In prior work, Applicant theorized that certain superlattices as described herein reduce the effective mass of charge carriers and that this thereby leads to higher charge carrier mobility. See, e.g., U.S. Pat. No. 6,897,472, which is hereby incorporate herein in its entirety by reference.

Further development by Applicant has established that the presence of MST layers may advantageously improve the mobility of free carriers in semiconductor materials, e.g., at interfaces between silicon and insulators like $SiO_2$ or $HfO_2$. Applicant theorizes, without wishing to be bound thereto, that this may occur due to various mechanisms. One mechanism is by reducing the concentration of charged impurities proximate to the interface, by reducing the diffusion of these impurities, and/or by trapping the impurities so they do not reach the interface proximity. Charged impurities cause Coulomb scattering, which reduces mobility. Another mechanism is by improving the quality of the interface. For example, oxygen emitted from an MST film may provide oxygen to a Si—$SiO_2$ interface, reducing the presence of sub-stoichiometric $SiO_x$. Alternately, the trapping of interstitials by MST layers may reduce the concentration of interstitial silicon proximate to the Si—$SiO_2$ interface, reducing the tendency to form sub-stoichiometric $SiO_x$. Sub-stoichiometric $SiO_x$ at the Si—$SiO_2$ interface is known to exhibit inferior insulating properties relative to stoichiometric $SiO_2$. Reducing the amount of sub-stoichiometric $SiO_x$ at the interface may more effectively confine free carriers (electrons or holes) in the silicon, and thus improve the mobility of these carriers due to electric fields applied parallel to the interface, as is standard practice in field-effect-transistor ("FET") structures. Scattering due to the direct influence of the interface is called "surface-roughness scattering", which may advantageously be reduced by the proximity of MST layers followed by anneals or during thermal oxidation.

In addition to the enhanced mobility characteristics of MST structures, they may also be formed or used in such a manner that they provide piezoelectric, pyroelectric, and/or ferroelectric properties that are advantageous for use in a variety of different types of devices, as will be discussed further below.

Figure 2:
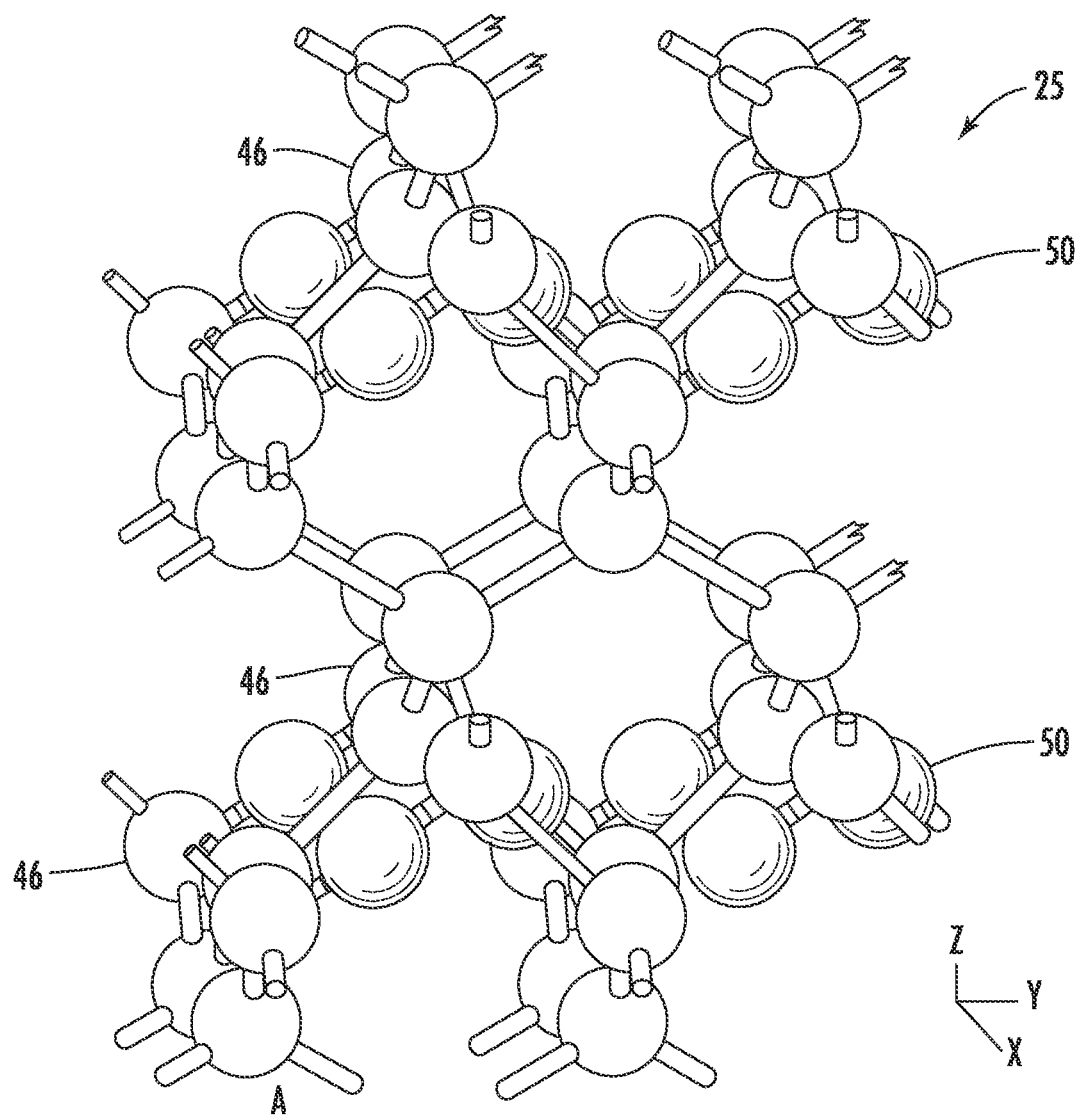
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and a non-semiconductor monolayer(s) 50 thereon. The non-semiconductor monolayers 50 are indicated by stippling in FIG. 1 for clarity of illustration.

The non-semiconductor monolayer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that non-semiconductor monolayers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present embodiments, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each non-semiconductor monolayer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the non-semiconductor monolayer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the embodiments may be readily adopted and implemented, as will be appreciated by those skilled in the art.

Figure 3:
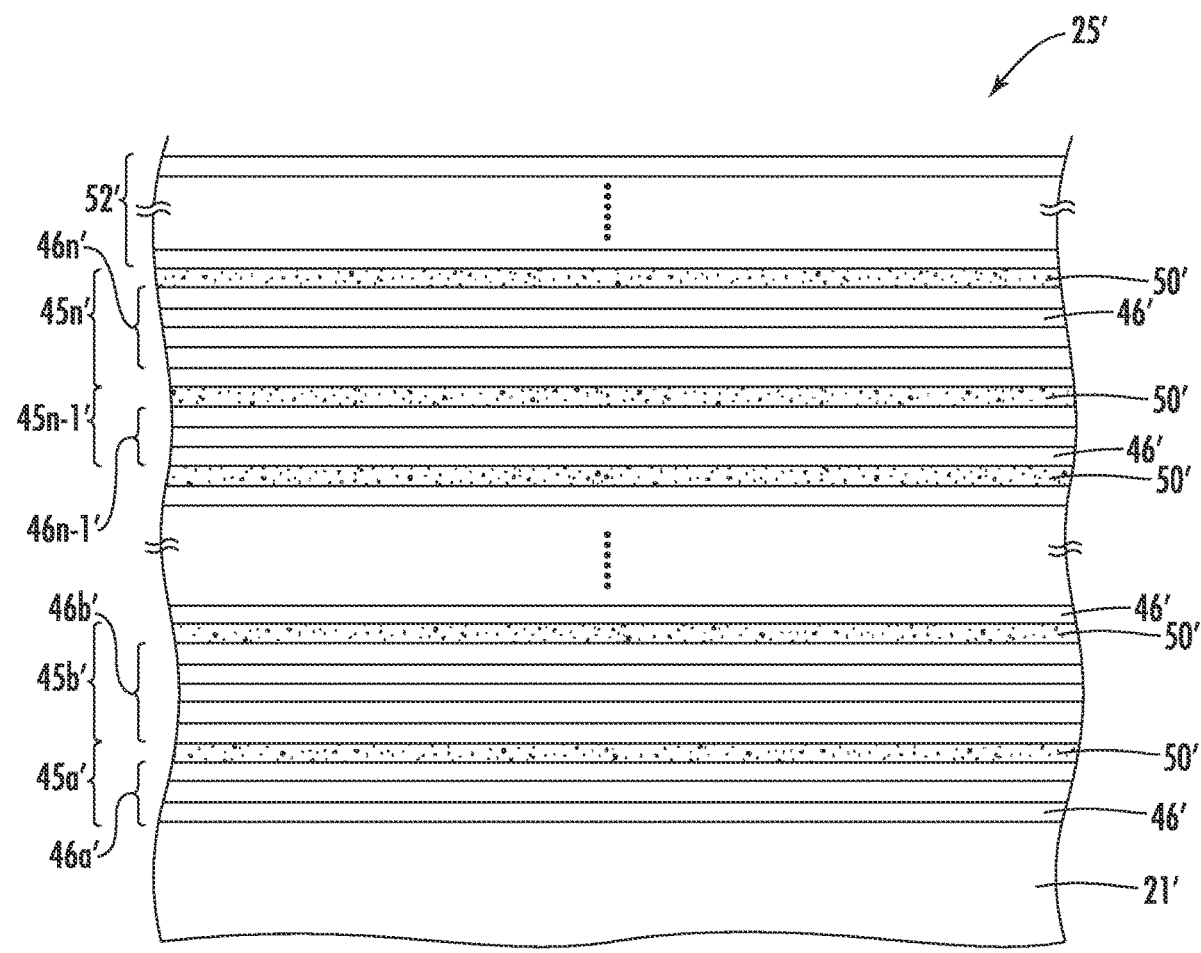
FIG. 3 is a greatly enlarged schematic cross-sectional view of another embodiment of a superlattice in accordance with an example embodiment.

Referring now additionally to FIG. 3, another embodiment of a superlattice 25' in accordance with the embodiments having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The non-semiconductor monolayers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
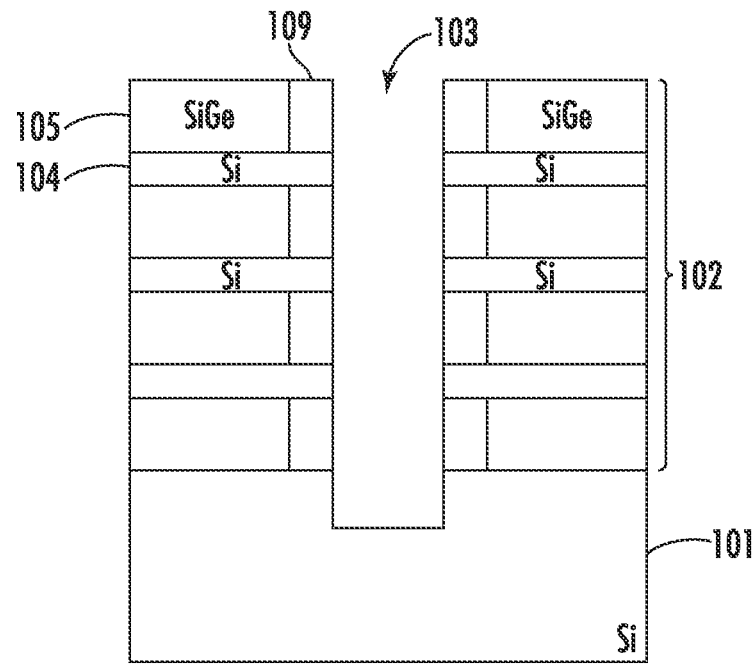
FIGS. 4A-4E are a series of cross-sectional diagrams illustrating a method of making a nanosheet transistor with superlattice dopant blocking layers in accordance with an example embodiment.

Turning to FIGS. 4A-4E, a method for making nanosheet transistor devices which incorporate the above-described superlattice structures, such as to advantageously provide dopant blocking between the source/drain and nanosheet channel layers, is now described. A plurality of gate stacks 102 are formed on a silicon substrate 101, followed by source/drain recesses 103 (FIG. 4A). In the illustrated example, each gate stack 102 includes alternating silicon (Si) nanosheets 104 and silicon germanium (SiGe) (e.g., boron-doped SiGe) layers 105, with inner spacers 109 (e.g., $SiO_2$) on the ends of the SiGe layers, although different materials may be used in different embodiments.

Figure 4B:
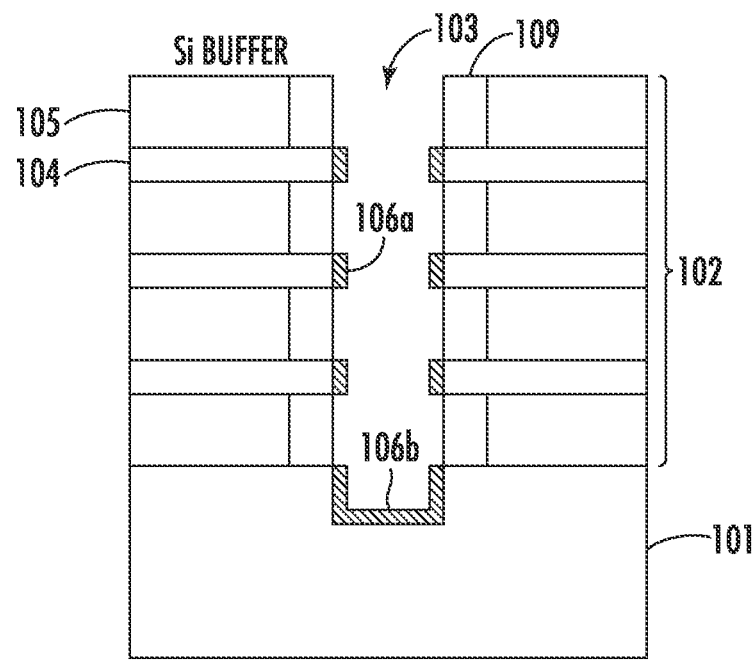
Figure 4C:
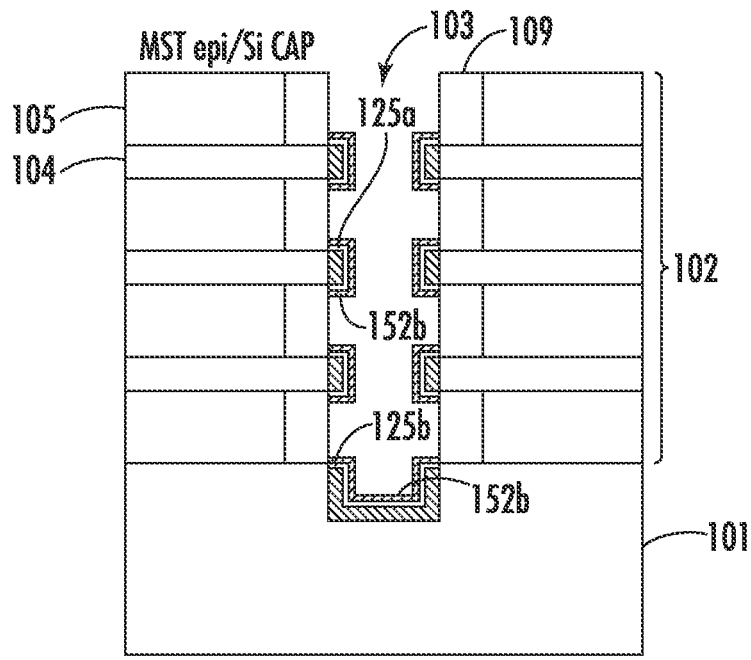

In some embodiments, silicon buffers 106a, 106b may optionally be epitaxially grown on the sides of the nanosheets 104 and the substrate 101 within the recess 103, respectively (FIG. 4B). The buffers 106a, 106b may help mitigate any surface roughness prior to formation of the MST superlattice films, which helps to prevent or reduce defects therein. In an example implementation, the buffers 106a, 106b may have a thickness of 2 nm or less, although other thicknesses may be used in different embodiments.

MST film and cap formation may then be performed (FIG. 4C) to define superlattices 125a and cap layers 152a on the buffers 106a, as well as a superlattice 125b and cap layer 152b on the buffer 106b (FIG. 4D), as described above. By way of example, the superlattices 125a, 125b may have two or three non-semiconductor monolayers 50 (e.g., two or three oxygen-inserted monolayers), although other numbers may be used in different embodiments.

Figure 4D:
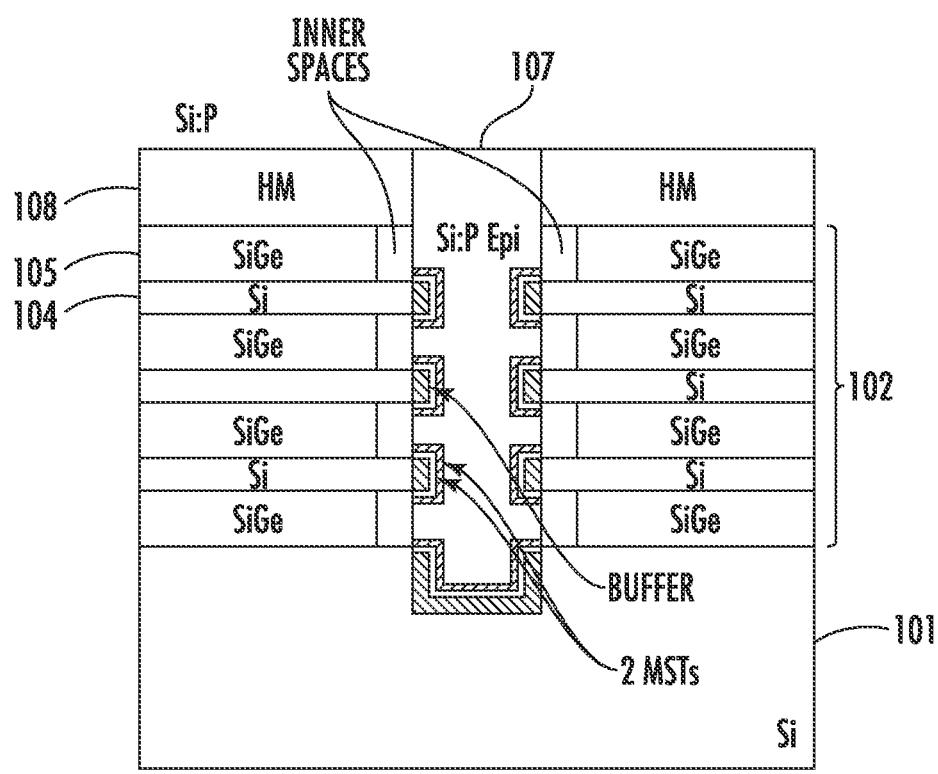
Figure 4E:
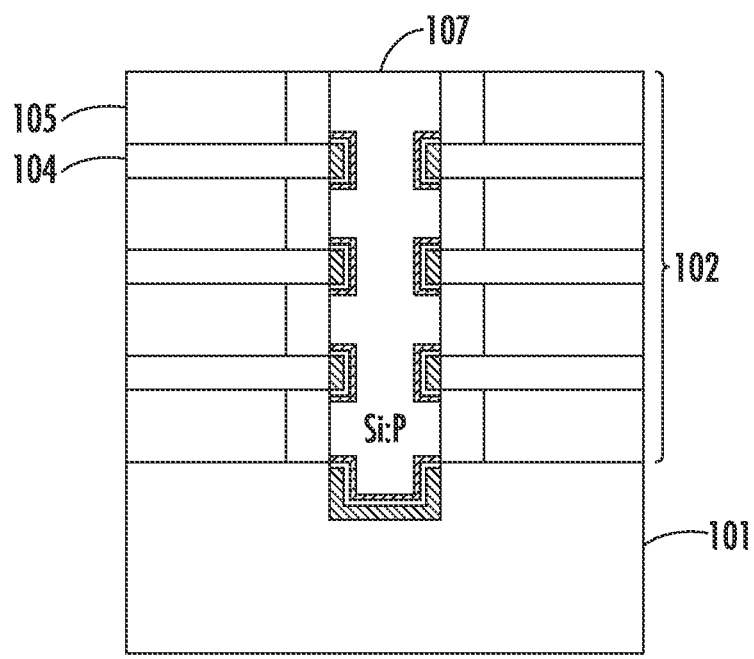

Source/drain regions 107 may then be formed within the recesses 103 using a hard mask 108 (FIG. 4D). In the illustrated example, this is done with a Si:P growth, although other source/drain materials may be used in different embodiments. It should be noted that the Si:P growth occurs over the cap layers 152a, 152b in the illustrated example, but in some embodiments these cap layers may be omitted. After removal of the hard mask 108 (FIG. 4E), additional processing steps may be performed to complete the nanosheet transistor, such as removing the SiGe layers 105 and forming a gate-all-around (GAA) structure in which the nanosheets 104 provide a plurality of stacked channels between the source/drain regions 107, as will be appreciated by those skilled in the art. Further details regarding the formation of GAA devices are provided in U.S. Pat. Pubs. US2022/0005926, US2022/0005927, US2022/0384600, US2022/0376047, and US2023/0121774, all of which are also assigned to the present Applicant and are hereby incorporated herein in their entireties by reference. It should be noted that other nanostructures besides nanosheets 104 (e.g., nanotubes, etc.) may be used in some configurations.

Figure 5A:
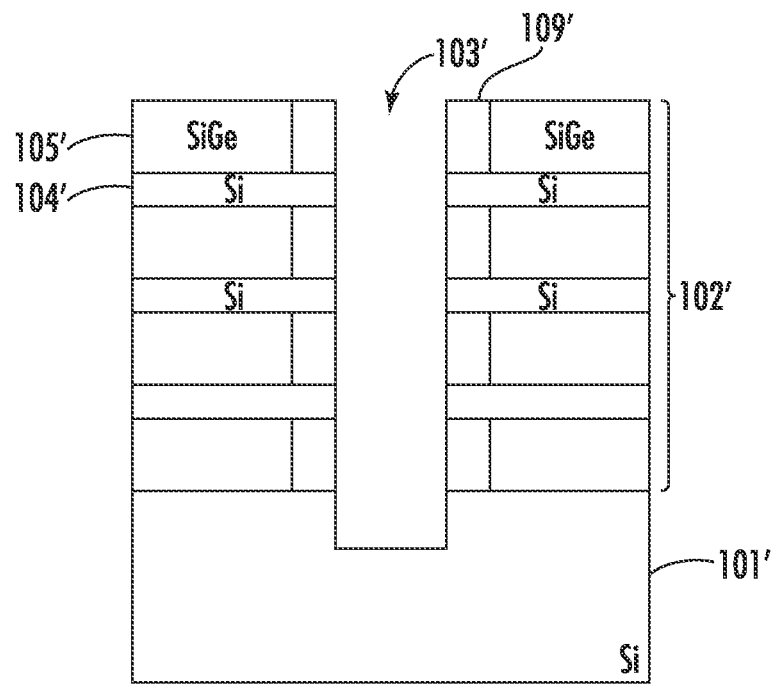
FIGS. 5A-5F are a series of cross-sectional diagrams illustrating another method of making a nanosheet transistor with superlattice dopant blocking layers in accordance with an example embodiment.
Figure 5B:
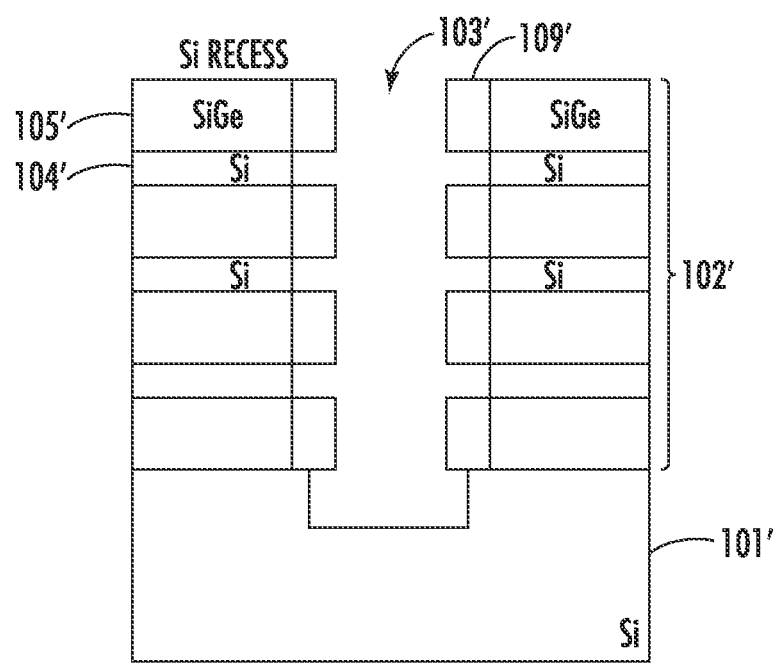
Figure 5C:
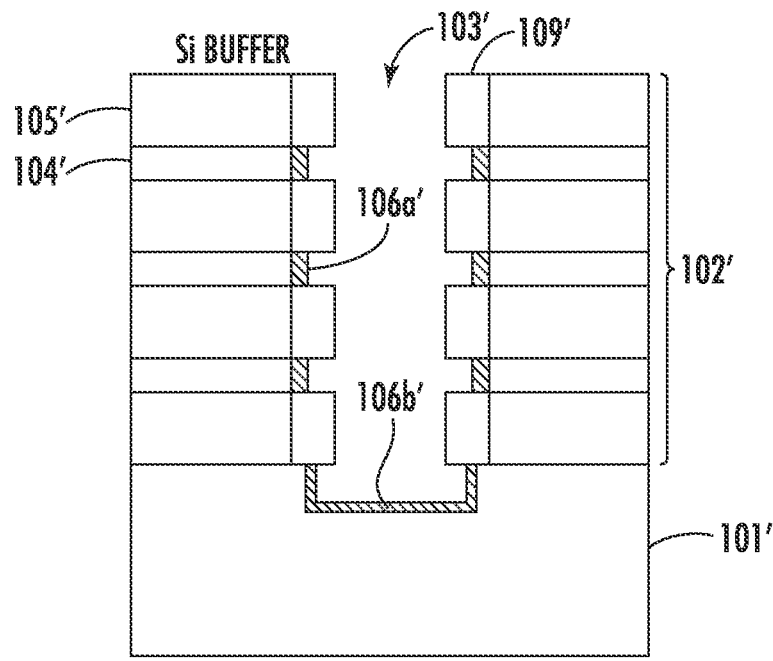
Figure 5D:
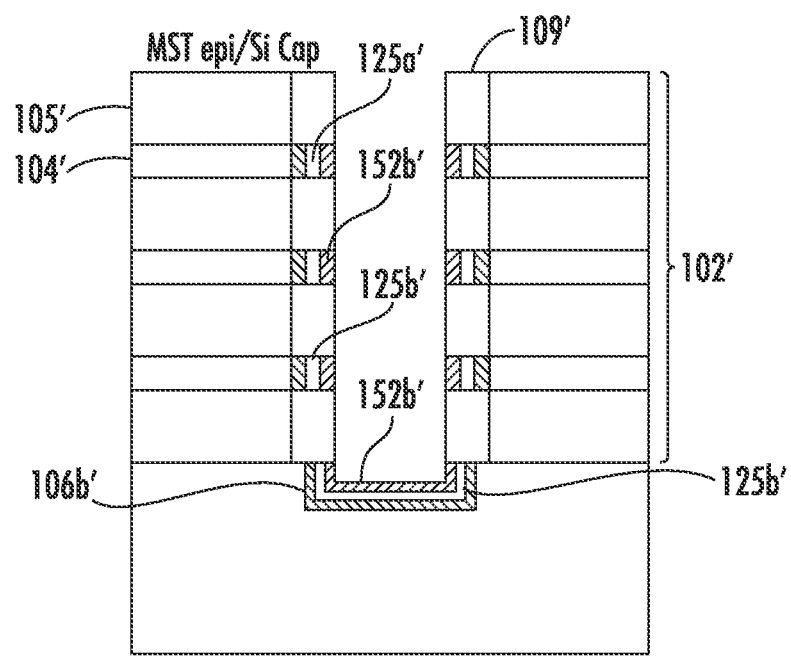
Figure 5E:
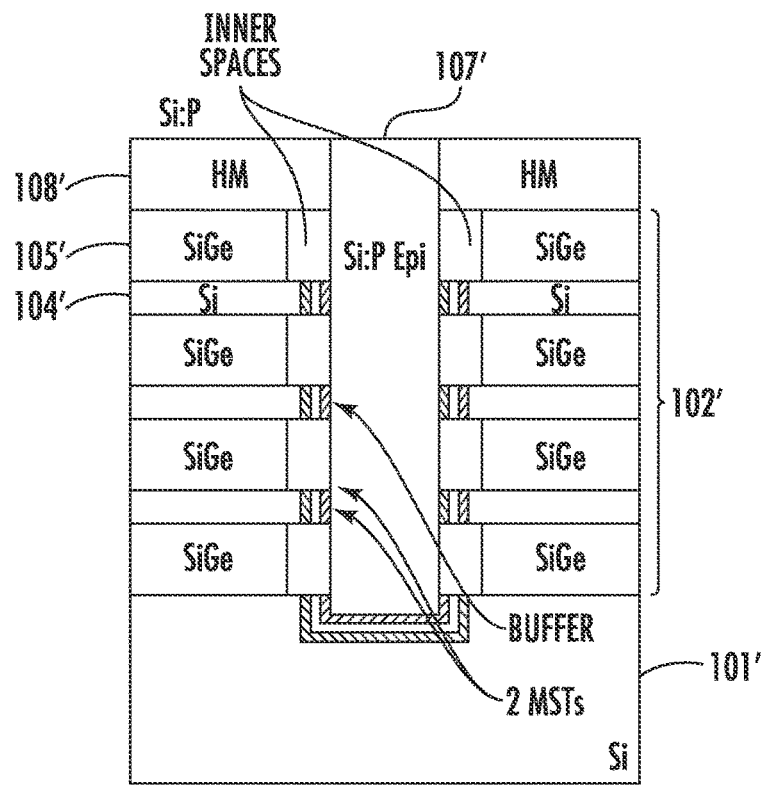
Figure 5F:
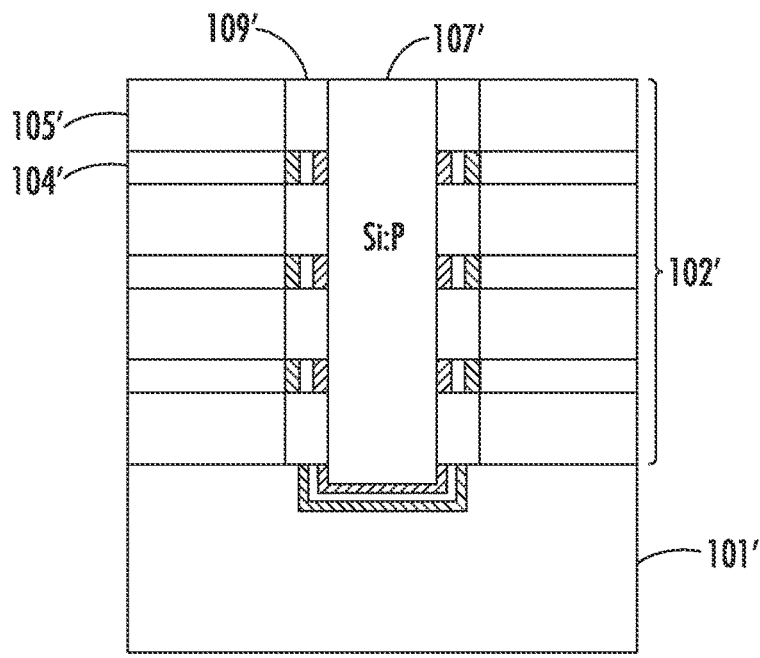

Referring additionally to FIGS. 5A-5F, another example approach for making nanosheet transistor devices is now described. This approach begins similarly to the one described above, although after the trench 103' is etched, then a further recess etch is performed on the silicon nanosheets 104' and substrate 101' (FIG. 5B). As such, the buffers 106a' and portions of the buffer 106b' are recessed laterally inside of the inner spacers 109' upon formation (FIG. 5C), as are the subsequent MST superlattice films 125a' and cap layers 152a', as well as portions of the superlattice 125b' and cap layer 152b', as seen in FIG. 5D. The source/drain region 107' formation (FIGS. 5E-5F) and subsequent processing steps may be similar to those described above.

It should be noted that in some embodiments the buffers 106a' and/or 106b' may be omitted, as the additional Si recess etching may provide sufficient surface smoothing without the buffer (s). Furthermore, formation of the cap layer 152b' may occur as part of the source/drain region 107' formation (Si:P process), which does not diminish the overall area available for the source/drain region. The cap layer 152' eventually gets doped with P during this process. Additionally, in some embodiments the cap layers 152a' and/or 152b' may optionally be omitted. More particularly, in an example implementation the MST and Si:P formation may both advantageously occur within the same chamber in-situ, in which case MST layers without a cap layer may still provide desired blocking capabilities. The Si:P 107' may then be etched where exposed through the hard mask 108', and a metal 120' deposited thereover (FIG. 5F), followed by silicide formation to define a contact.

While the superlattices 125a' provide similar dopant blocking capabilities (i.e., blocking the phosphorous in the source/drain regions 107' from the nanosheet 104 channel layers) to the superlattices 125a described above, the present approach may provide an additional advantage in that the buffers 106a', superlattices 125a', and cap layers 152a' do not protrude into the source/drain regions 107'. By way of example, this configuration may occupy significantly less source/drain area, on the order of 11-25% in some embodiments, whereas the above-described approach may create additional resistance due to the loss of available source/drain surface area, which may be undesirable in certain embodiments.

Figure 6A:
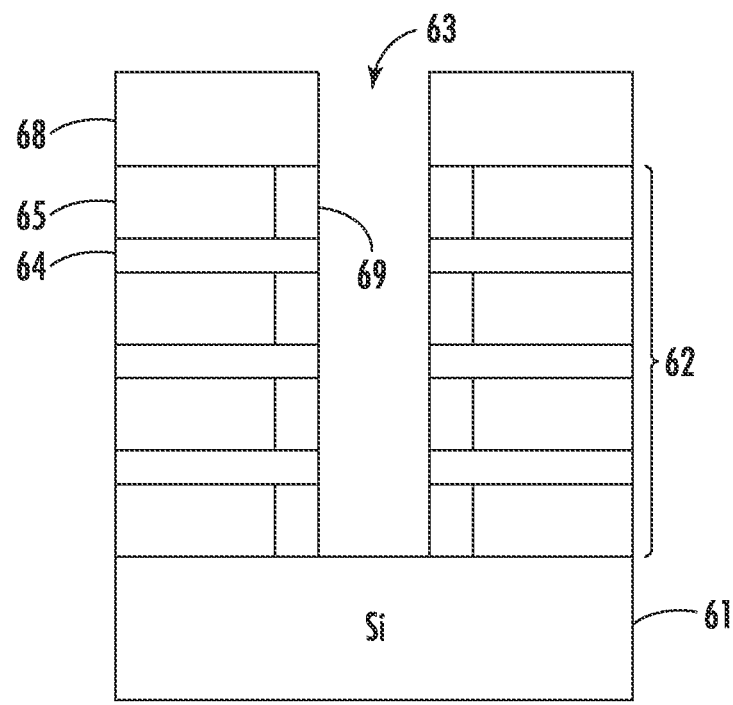
FIGS. 6A-6D are a series of cross-sectional diagrams illustrating a conventional method of making a nanosheet transistor in accordance with the prior art.
Figure 6B:
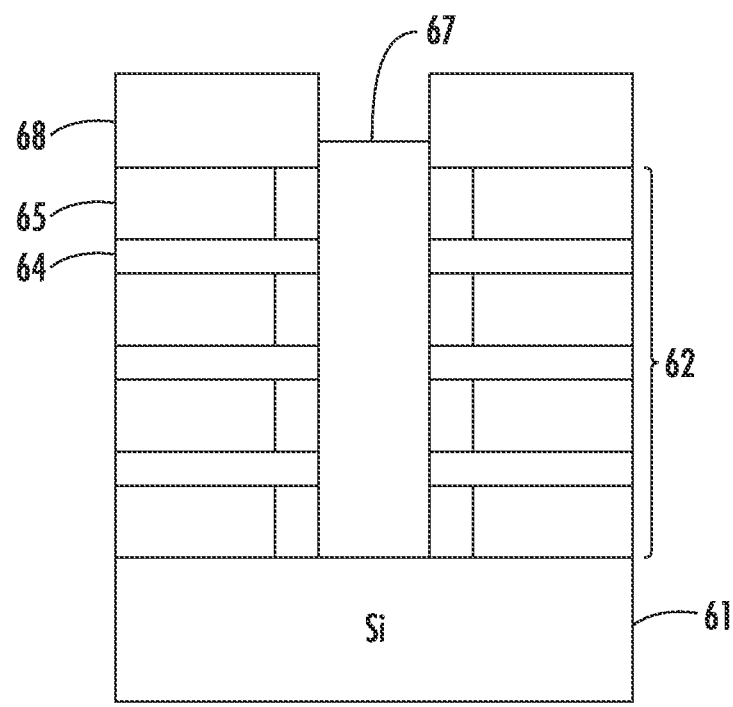
Figure 6C:
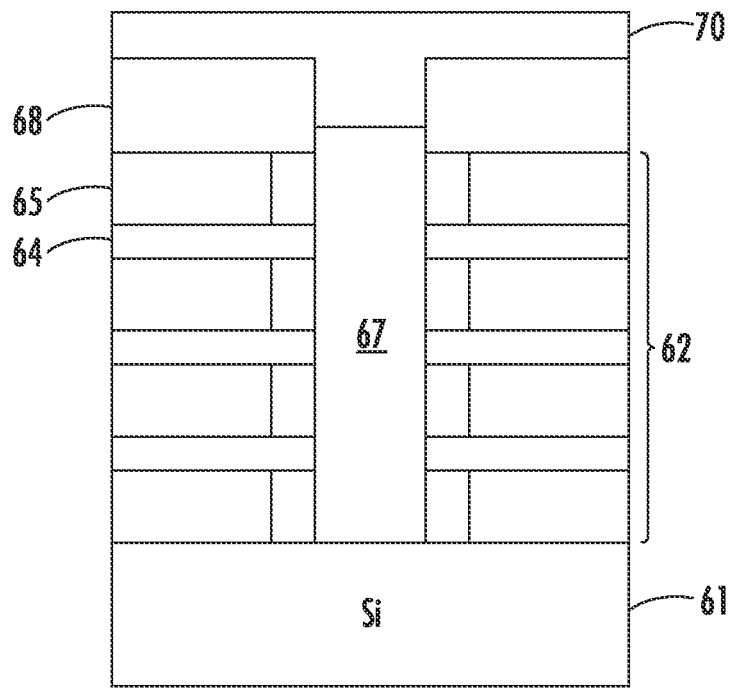
Figure 6D:
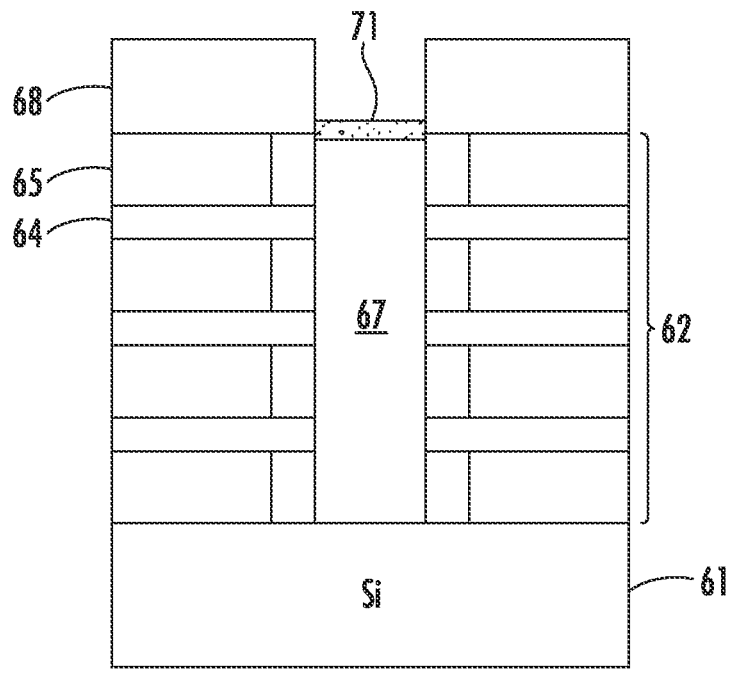

Turning to FIGS. 6A-6D, a conventional approach for making nanosheet transistor devices is now described. This approach begins with forming a plurality of gate stacks 62 on a silicon substrate 61, followed by source/drain recesses 63 via a hard mask 68 (FIG. 6A), as similarly described above. In the illustrated example, each gate stack 62 includes alternating silicon (Si) nanosheets 64 and silicon germanium (SiGe) layers 65. Source/drain regions 67 and inner spacers 69 may then be formed within the recesses 63 using the hard mask 68 (FIG. 6B). In the illustrated example, this is done with a Si:P growth, although other source/drain materials may be used in different embodiments. A metal layer 70 is formed over the hard mask 68 and the source/drain region 67 (FIG. 6C), followed by silicidation/metal removal (FIG. 6D) to define a source/drain contact 71. The hard mask 68 may then be removed.

Figure 7A:
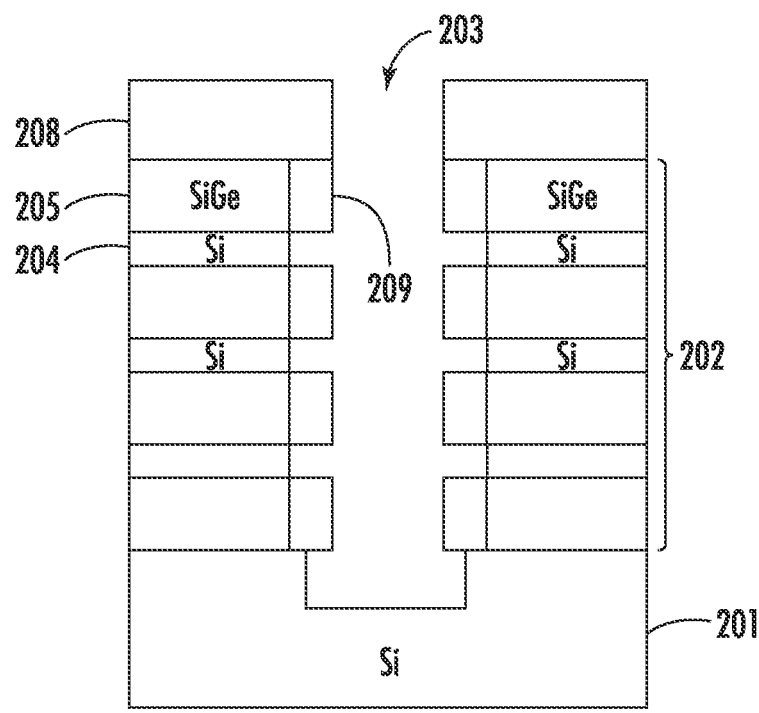
FIGS. 7A-7H are a series of cross-sectional diagrams illustrating another method of making a nanosheet transistor with superlattice dopant blocking layers and providing enhanced contact area in accordance with an example embodiment.

A potential drawback of this conventional approach is that there is a relatively small amount of contact area between the contact 70 and the source/drain region 67 (i.e., only at the top of the source/drain region), which may result in relatively high contact resistance. Various example embodiments which provide for enhanced contact area, and therefore lower contact resistance, are now described. One such example embodiment is described with reference to FIGS. 7A-7H. A plurality of gate stacks 202 are formed on a silicon substrate 201, followed by source/drain recesses 203 (FIG. 7A). In the illustrated example, each gate stack 102 includes alternating silicon (Si) nanosheets 204 and silicon germanium (SiGe) layers 205, with inner spacers 209 (e.g., $SiO_2$) on the ends of the SiGe layers, as similarly discussed above.

Figure 7B:
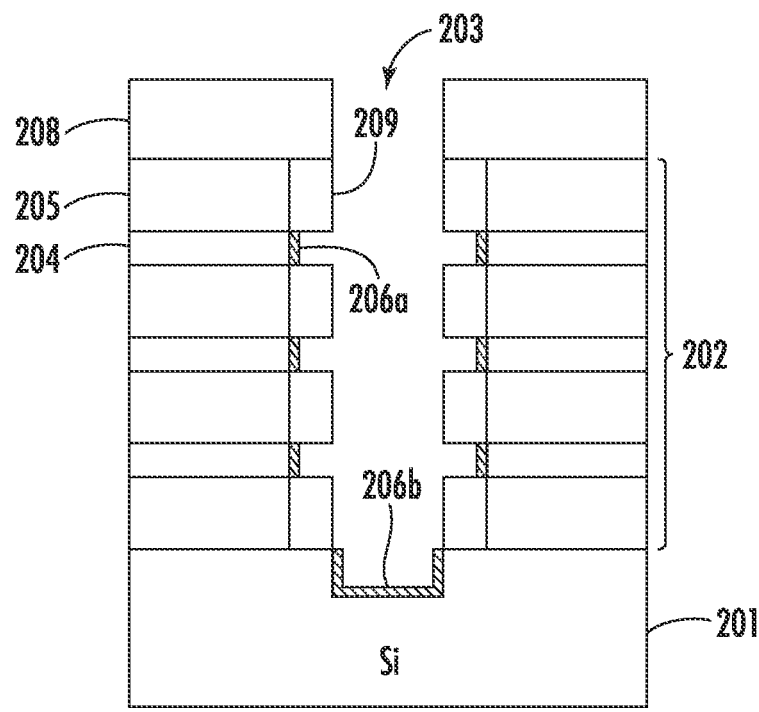
Figure 7C:
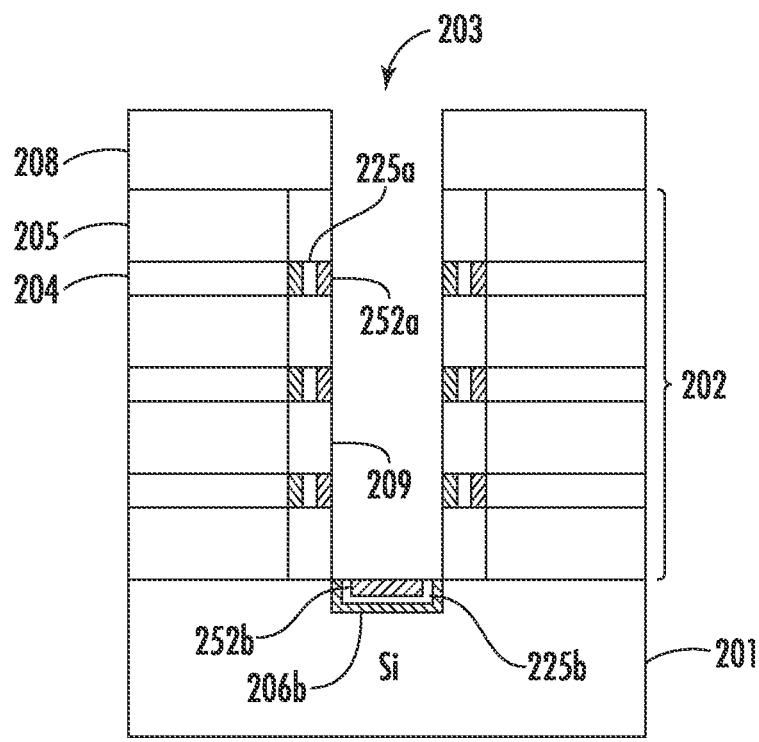
Figure 7D:
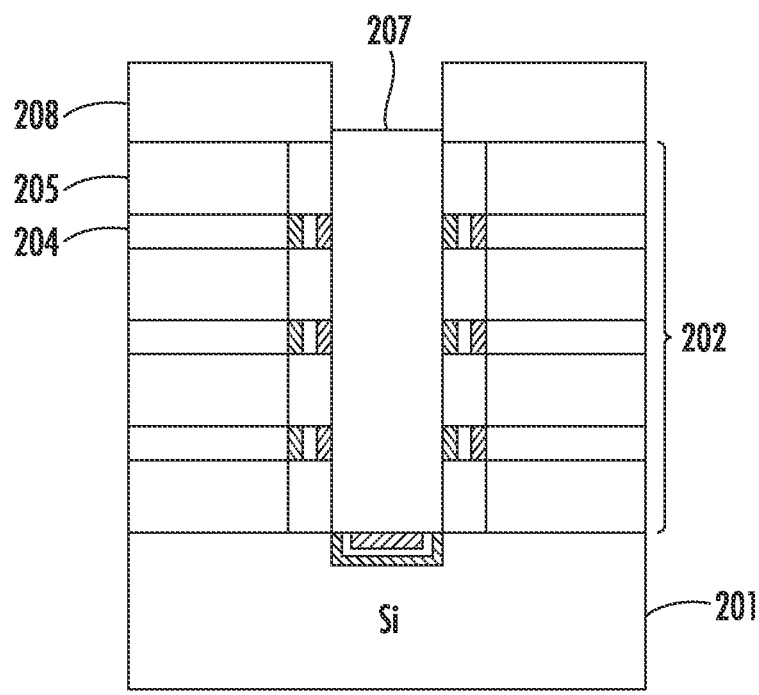

In some embodiments, silicon buffers 206a, 206b may optionally be epitaxially grown on the sides of the nanosheets 204 and the substrate 201 within the recess 203, respectively (FIG. 7B). As noted above, the buffers 206a, 206b may help mitigate any surface roughness prior to formation of the MST superlattice films, which helps to prevent or reduce defects therein. MST film and cap formation may then be performed (FIG. 7C) to define superlattices 225a, 225b and cap layers 252a, 252b on the buffers 206a, 206b (FIG. 7D), respectively, as similarly described above. Source/drain regions 207 (e.g., Si:P) may then be formed within the recesses 203 using a hard mask 208 (FIG. 7D). Here again, in the illustrated example the Si:P growth occurs over the cap layers 152, but in some embodiments these cap layers may be omitted.

Figure 7E:
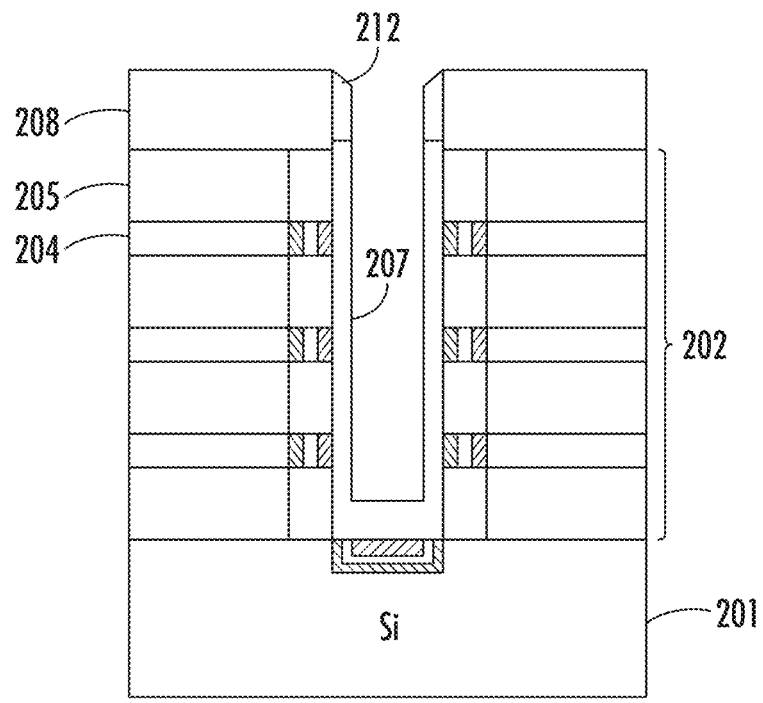
Figure 7F:
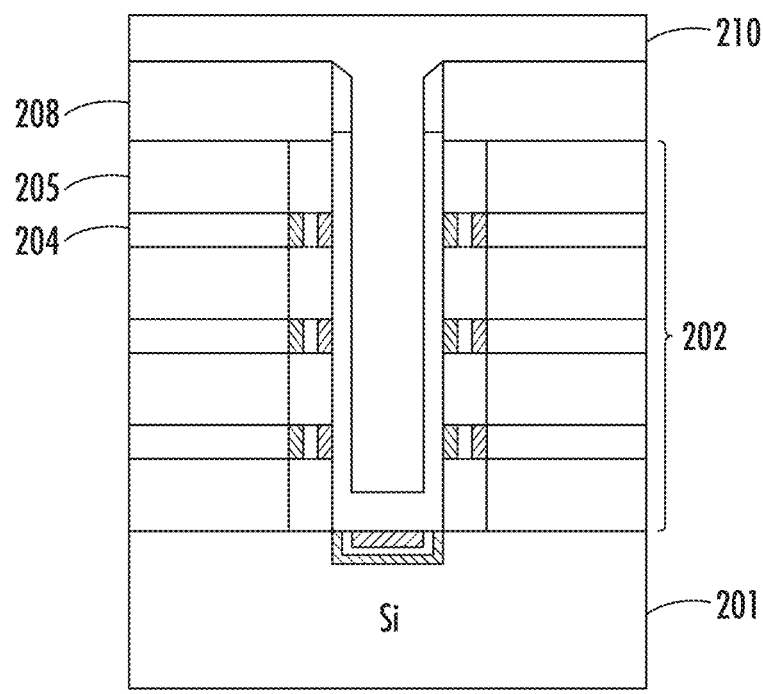
Figure 7G:
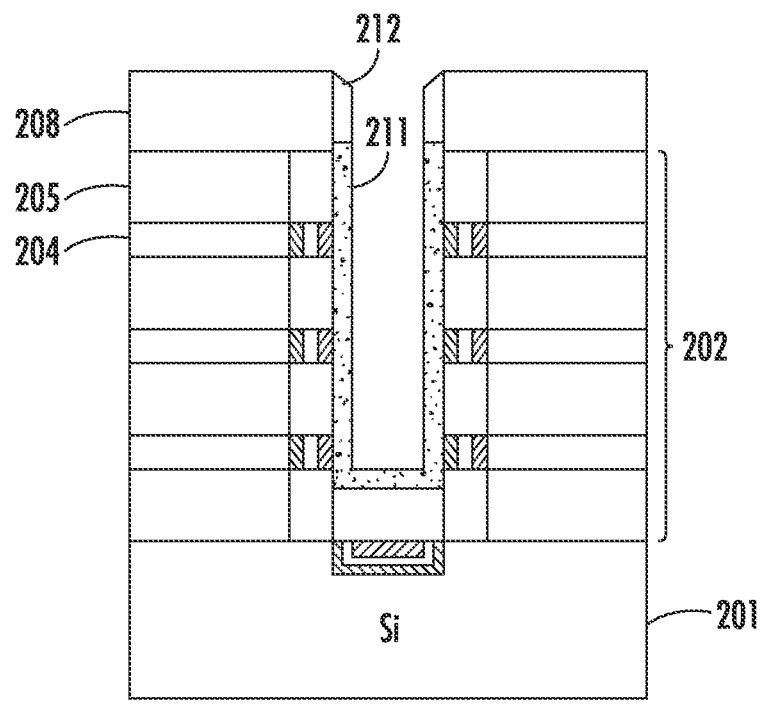
Figure 7H:
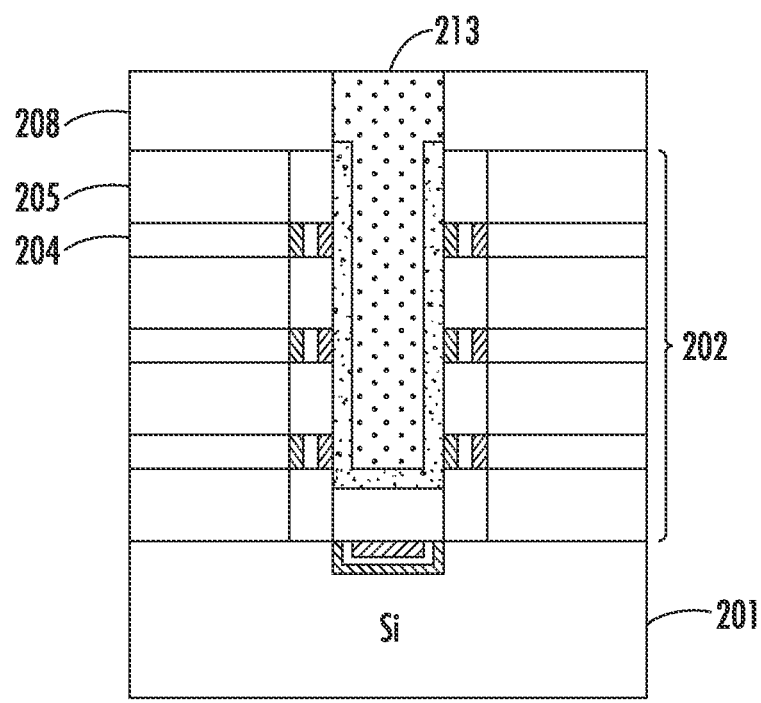

Next, spacers 212 are formed on the inside edges of the hard mask 208, allowing the Si:P to be etched such that a Si:P liner remains within the trench 203 (FIG. 7E). Thereafter, a metal layer 210 may be deposited over the hard mask 208 and filling the trench 203 (FIG. 7F), followed by silicidation and metal removal (FIG. 7G) to define a contact liner 211 along the bottom and sidewalls of the trench 203, which may then be filled with a metal plug 213 to complete the contact structure (FIG. 7H). As discussed further above, the hard mask 208 may then be removed and additional processing steps performed to complete the nanosheet transistor.

Figure 8A:
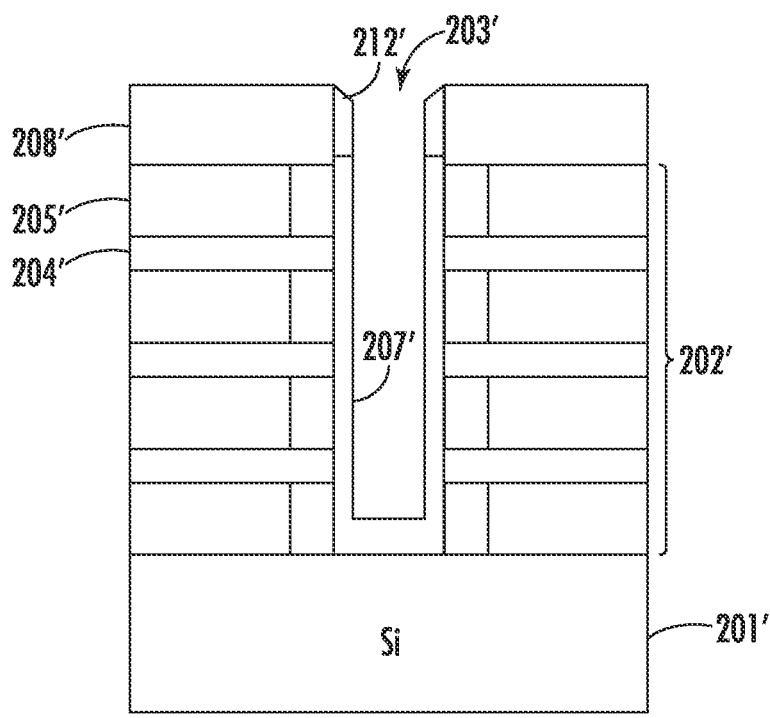
FIGS. 8A-8C are a series of cross-sectional diagrams illustrating still another method of making a nanosheet transistor providing enhanced contact area in accordance with an example embodiment.
Figure 8B:
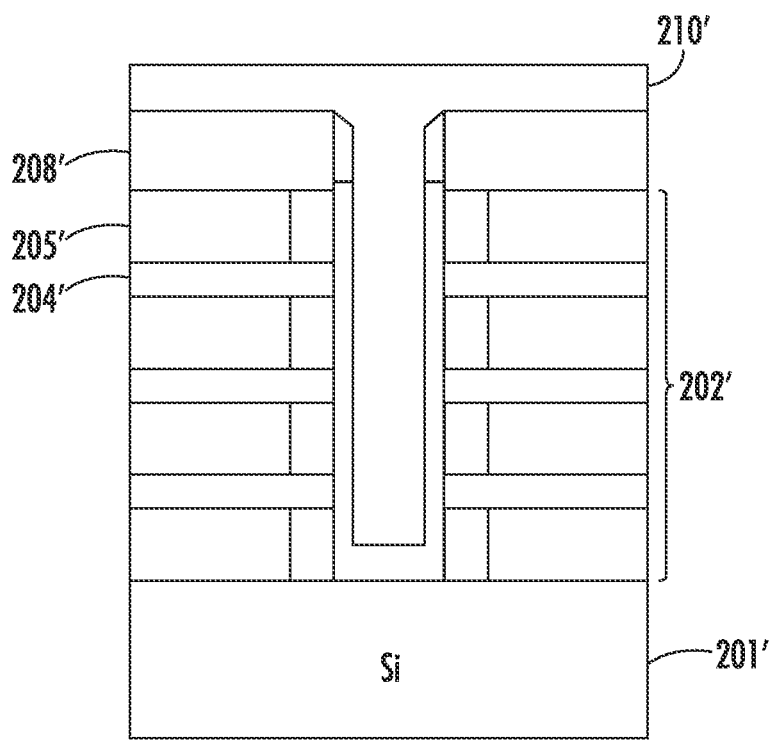
Figure 8C:
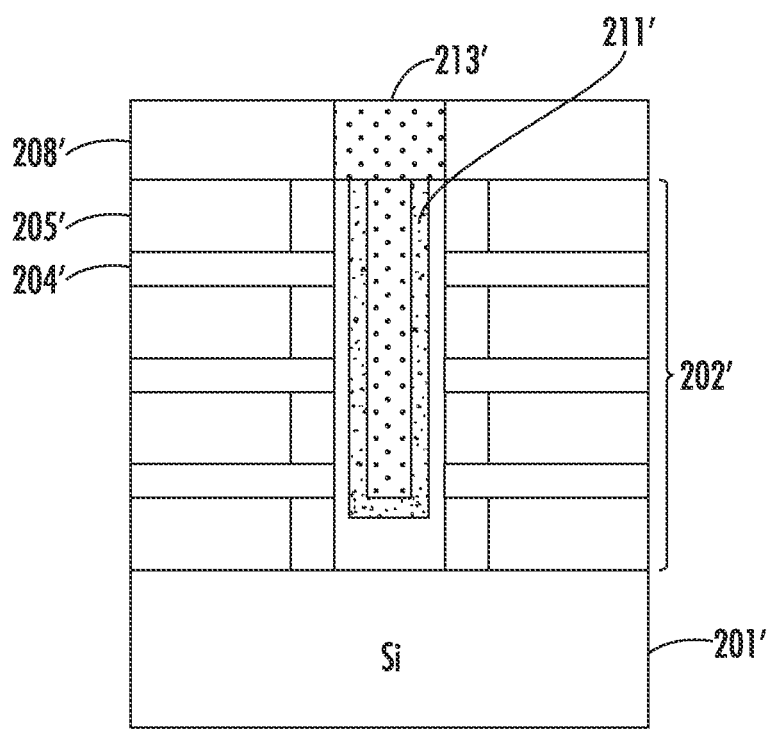

Another example embodiment which provides reduced contact resistance is now described with reference to FIGS. 8A-8C. Beginning with the structure shown in FIG. 6B, here spacers 212' are next formed on the inside edges of the hard mask 208', allowing the Si:P to be etched such that a Si:P liner remains within the trench 203' (FIG. 8A). Thereafter, a metal layer 210' may be deposited over the hard mask 208' and filling the trench 203' (FIG. 8B), followed by silicidation/metal removal and metal plug 213' formation (FIG. 8C), as described above. The resulting structure is similar to that of FIG. 7H, with the exception that MST films 225 and cap layers 252 are omitted in this embodiment. Here again, the hard mask 208' may then be removed and additional processing steps performed to complete the nanosheet transistor.

Figure 9A:
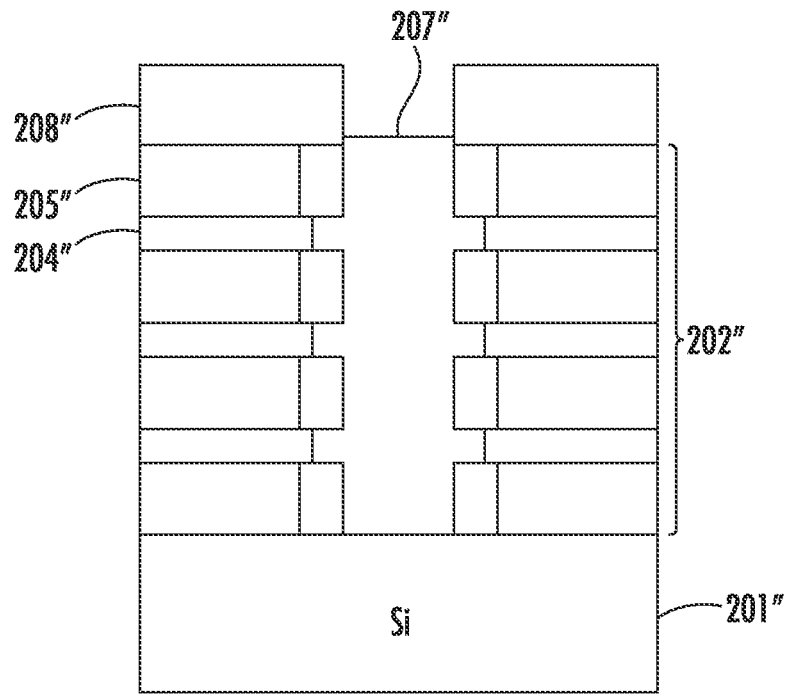
FIGS. 9A-9D are a series of cross-sectional diagrams illustrating yet another method of making a nanosheet transistor providing enhanced contact area in accordance with an example embodiment.
Figure 9B:
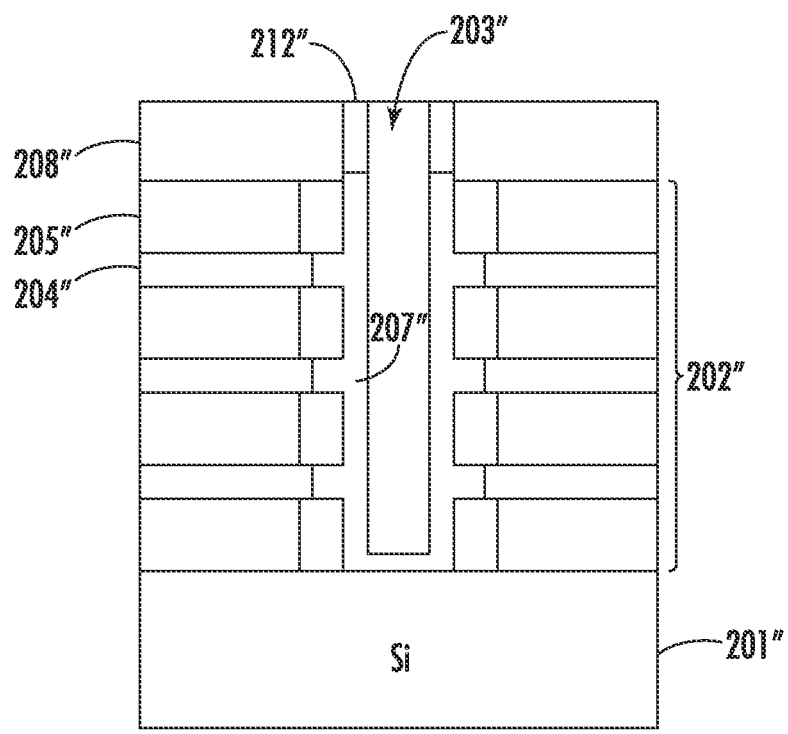
Figure 9C:
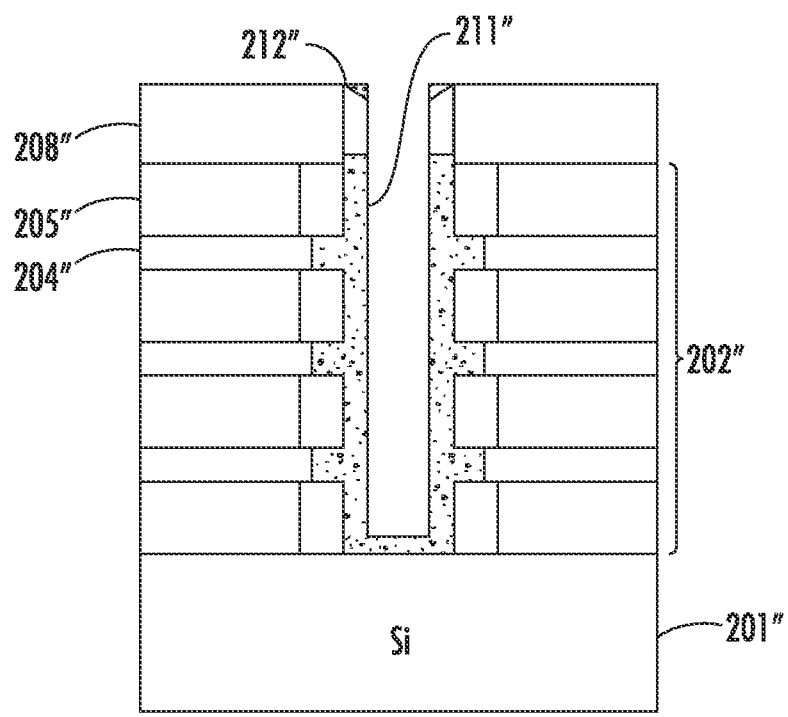
Figure 9D:
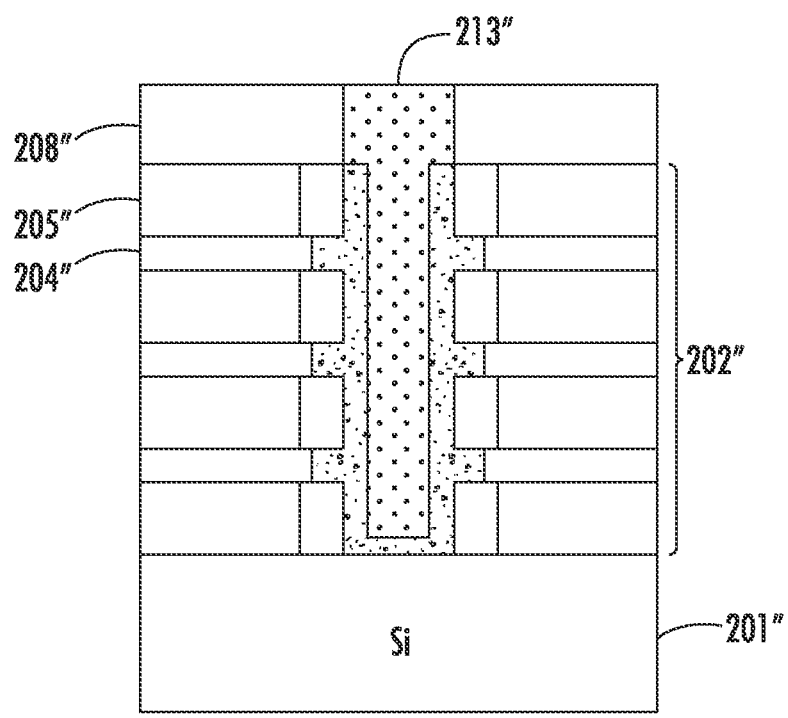

Still another example embodiment which provides reduced contact resistance is now described with reference to FIGS. 9A-9D. This approach begins with a structure similar to that of FIG. 7B, but the trench 203" is then filled with Si:P source/drain material 207" (FIG. 9A). Spacers 212" are next formed on the inside edges of the hard mask 208", allowing the Si:P to be etched such that a Si:P liner remains within the trench 203' (FIG. 9B). Thereafter, metal deposition followed by silicidation/metal removal (FIG. 9C) and metal plug 213" formation (FIG. 9D) may be performed, as described above. Here again, the hard mask 208" may then be removed and additional processing steps performed to complete the nanosheet transistor.

Figure 10A:
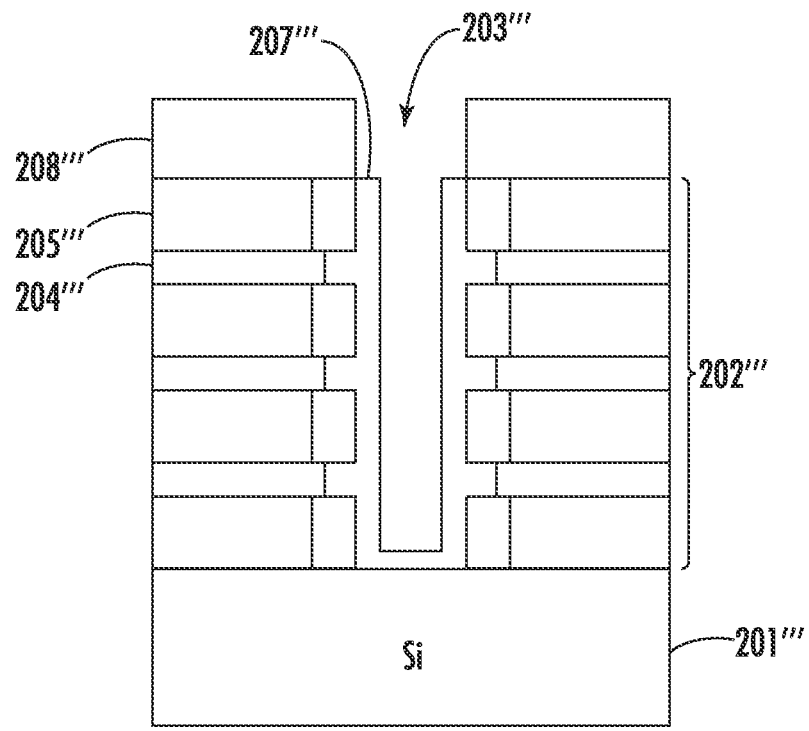
FIGS. 10A-10D are a series of cross-sectional diagrams illustrating another method of making a nanosheet transistor providing enhanced contact area in accordance with an example embodiment.
Figure 10B:
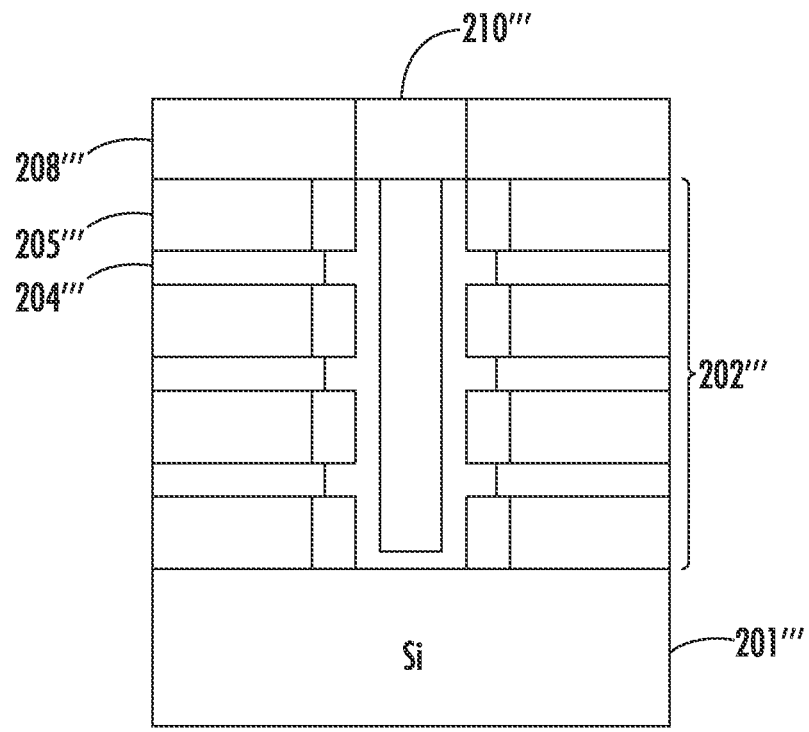
Figure 10C:
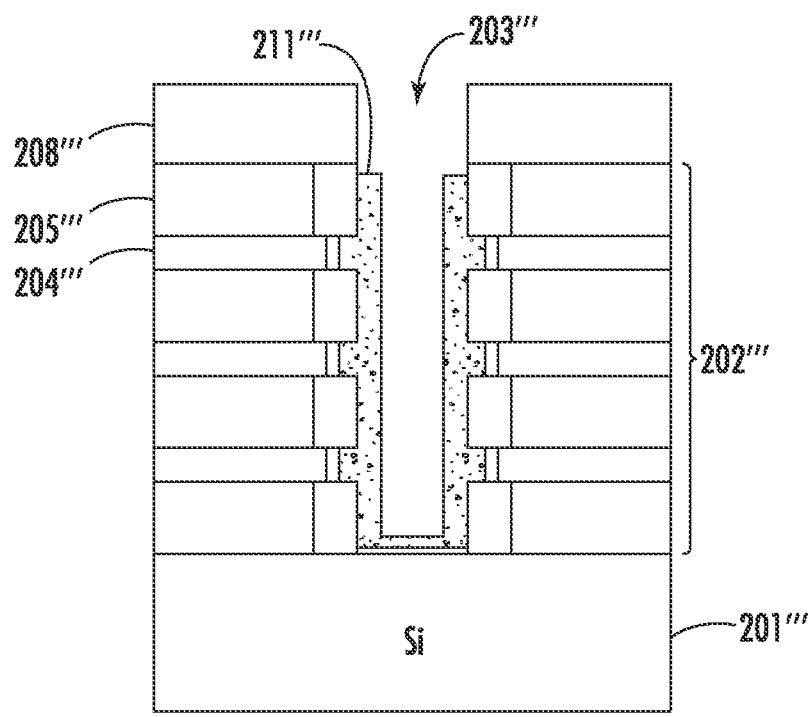
Figure 10D:
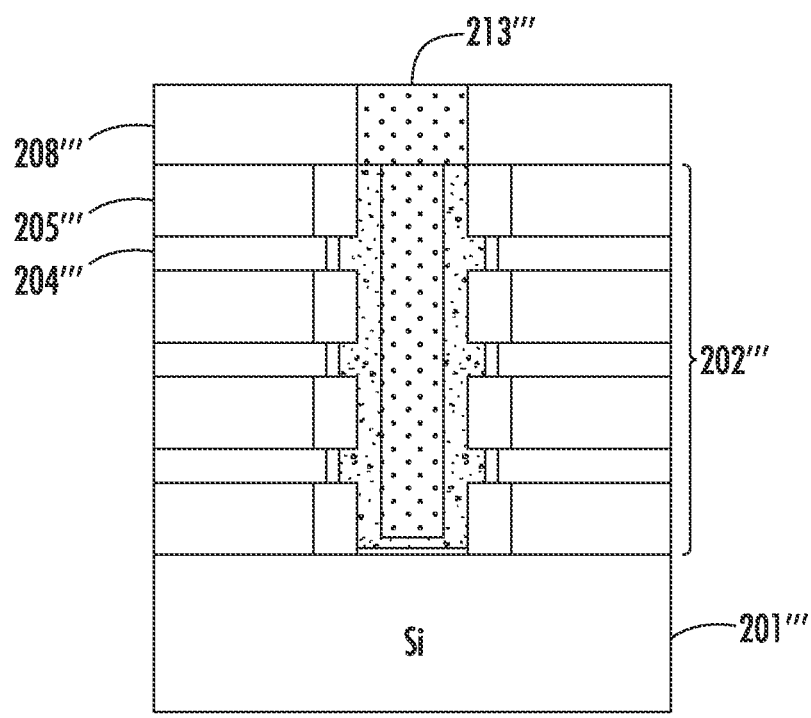

Yet another example embodiment which provides reduced contact resistance is now described with reference to FIGS. 10A-10D. This approach also begins with a structure similar to that of FIG. 7B, but a partial deposition of Si:P source/drain material 207''' is performed to line (but not completely fill) the trench 203''' (FIG. 10A). Thereafter, metal 210''' deposition followed by silicidation/metal removal (FIG. 10C) and metal plug 213''' formation (FIG. 10D) may be performed, as described above. Here again, the hard mask 208''' may then be removed and additional processing steps performed to complete the nanosheet transistor. With respect to the partial deposition of Si:P, it should be noted that this approach may also be used in the above-described embodiments (with or without the use of MST layers) rather than fully filling the trench with Si:P. Moreover, in another similar approach to that shown in FIGS. 10A-10D, all of the illustrated steps would be the same except the process would begin with a structure similar to that of FIG. 6A (i.e., where no silicon recess of the nanosheets 203''' is performed prior to the Si:P partial deposition).

Example dimensions which may be used for one of more of the following embodiments include: gate height=~63 nm; gate length (Lg)=~12 nm; SiGe layer thickness=~12.8 nm; and Si nanosheet thickness=~5 nm. However, it will be appreciated that other dimensions are possible in different configurations, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a semiconductor device comprising:
    forming a plurality of spaced apart gate stacks on a substrate defining respective trenches therebetween, each gate stack comprising alternating layers of first and second semiconductor materials, the layers of the second semiconductor material defining nanostructures;
    forming respective source/drain regions within the trenches;
    forming respective insulating regions adjacent lateral ends of the layers of the first semiconductor material; and
    forming respective dopant blocking superlattices adjacent lateral ends of the nanostructures and offset outwardly from adjacent surfaces of the insulating regions, each dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 further comprising forming a respective semiconductor buffer layer between each nanostructure and the adjacent dopant blocking superlattice.

3. The method of claim 1 comprising forming a respective lateral bottom dopant blocking superlattice between the substrate and the source/drain regions, each lateral bottom dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

4. The method of claim 1 wherein the first semiconductor material comprises silicon germanium.

5. The method of claim 1 wherein the second semiconductor material comprises silicon.

6. The method of claim 1 wherein the source/drain regions comprise phosphorus doped silicon (Si:P).

7. The method of claim 1 wherein the base semiconductor monolayers comprise silicon.

8. The method of claim 1 wherein the non-semiconductor monolayers comprise oxygen.

9. A method for making a semiconductor device comprising:
    forming a plurality of spaced apart gate stacks on a substrate defining respective trenches therebetween, each gate stack comprising alternating layers of first and second semiconductor materials, the layers of the second semiconductor material defining nanostructures;

forming respective source/drain regions within the trenches;

forming respective insulating regions adjacent lateral ends of the layers of the first semiconductor material;

forming respective dopant blocking superlattices adjacent lateral ends of the nanostructures and offset outwardly from adjacent surfaces of the insulating regions, each dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;

forming a respective semiconductor buffer layer between each nanostructure and the adjacent dopant blocking superlattice; and forming a respective lateral bottom dopant blocking superlattice between the substrate and the source/drain regions, each lateral bottom dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

10. The method of claim 9 wherein the first semiconductor material comprises silicon germanium.

11. The method of claim 9 wherein the second semiconductor material comprises silicon.

12. The method of claim 9 wherein the source/drain regions comprise phosphorus doped silicon (Si:P).

13. The method of claim 9 wherein the base semiconductor monolayers comprise silicon.

14. The method of claim 9 wherein the non-semiconductor monolayers comprise oxygen.

15. A method for making a semiconductor device comprising:
forming a plurality of spaced apart gate stacks on a substrate defining respective trenches therebetween, each gate stack comprising alternating layers of first and second semiconductor materials, the layers of the second semiconductor material defining nanostructures;

forming respective source/drain regions within the trenches;

forming respective insulating regions adjacent lateral ends of the layers of the first semiconductor material; and forming respective dopant blocking superlattices adjacent lateral ends of the nanostructures and offset outwardly from adjacent surfaces of the insulating regions, each dopant blocking superlattice comprising a plurality of stacked groups of layers, each group of layers comprising a plurality of stacked base silicon monolayers defining a base silicon portion, and at least one oxygen monolayer constrained within a crystal lattice of adjacent base silicon portions.

16. The method of claim 15 further comprising forming a respective semiconductor buffer layer between each nanostructure and the adjacent dopant blocking superlattice.

17. The method of claim 15 comprising forming a respective lateral bottom dopant blocking superlattice between the substrate and the source/drain regions, each lateral bottom dopant blocking superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

18. The method of claim 15 wherein the first semiconductor material comprises silicon germanium.

19. The method of claim 15 wherein the second semiconductor material comprises silicon.

20. The method of claim 15 wherein the source/drain regions comprise phosphorus doped silicon (Si:P).

* * * * *